United States Patent [19]

Marcel

[11] Patent Number: 5,146,156
[45] Date of Patent: Sep. 8, 1992

[54] CURRENT INTENSITY TRANSFORMER DEVICE FOR MEASURING A VARIABLE ELECTRIC CURRENT

[75] Inventor: Etter Marcel, Troinex, Switzerland

[73] Assignee: Liaisons Electroniques Mecaniques Lem S.A., Switzerland

[21] Appl. No.: 506,697

[22] Filed: Apr. 9, 1990

[30] Foreign Application Priority Data

Apr. 13, 1989 [CH] Switzerland ............. 13399/89

[51] Int. Cl.$^5$ .............................. G01R 19/00
[52] U.S. Cl. .................. 324/127; 324/117 H; 324/117 R
[58] Field of Search ............ 324/127, 126, 117 H, 324/117 R, 251, 252; 307/309; 338/32 H; 313/357, 358

[56] References Cited

U.S. PATENT DOCUMENTS

| | | | |
|---|---|---|---|
| 2,928,048 | 3/1960 | Postal | 324/117 R |
| 3,573,616 | 4/1971 | Kahen | 324/251 |
| 4,099,238 | 7/1978 | Suzuki | 324/251 |
| 4,234,846 | 11/1980 | Maringer | 324/251 |
| 4,460,867 | 7/1984 | Fleissner | 324/117 H |
| 4,639,665 | 1/1987 | Gary | 324/117 H |
| 4,682,101 | 7/1987 | Cattaneo | 324/117 H |
| 4,961,049 | 10/1990 | Ghislanzoni | 324/117 H |

FOREIGN PATENT DOCUMENTS 0194225 10/1986 European Pat. Off. .
56-131825 2/1983 Japan .

*Primary Examiner*—Vinh Nguyen
*Attorney, Agent, or Firm*—Woodard, Emhardt, Naughton, Moriarty & McNett

[57] ABSTRACT

In the present current intensity transformer device, a magnetic circuit having an air-gap provided with a Hall cell, is coupled with a conductor for the current to be measured and with a measuring winding. An electric measuring circuit provides a first voltage which is a function of the magnetic field in the air-gap, and a second voltage which is a function of the current in the measuring winding. Both voltages are added together to provide a measure of variable currents, such as pulse currents or periodic currents of a strongly asymmetrical wave form, as well as direct currents or low frequency alternating currents with superposed strong high frequency undulation.

5 Claims, 3 Drawing Sheets

CURRENT INTENSITY TRANSFORMER DEVICE FOR MEASURING A VARIABLE ELECTRIC CURRENT

The present invention relates to a current intensity transformer device for measuring a variable electric current, comprising a current transformer with a magnetic circuit having at least one air-gap provided with a magnetic field detector, said magnetic circuit being arranged so that it can be coupled magnetically with a conductor for the current to be measured, and being coupled magnetically with at least one measuring winding.

A device of this type is described, for example, in the European patent application No. 0 194 225.

Such known devices work according to the principle of compensation of the magnetic fields generated, on the one hand, by the current to be measured and, on the other hand, by a measuring current which is made to flow in the measuring winding.

It appears that in certain applications, such as for example the measure of pulse currents or periodic currents of a strongly asymmetrical wave form, or the switch-on currents of alternating current networks, a conventional current transformer becomes saturated and, therefore, cannot be used. Furthermore, it is often desired to be able to measure direct currents or low frequency alternating currents with superposed strong high frequency undulation by means of a device which is relatively simple, inexpensive and compact.

The invention is aimed at providing a device which meets this need.

For this purpose, the device according to the invention comprises an electric measuring circuit arranged to provide, on the one hand, a first measuring signal ($U_S$) which is a function of the magnetic field in the air-gap of the magnetic circuit and, on the other hand, a second measuring signal ($U_R$) which is a function of the current in the measuring winding.

The magnetic field detector is preferably a Hall effect device, the measuring circuit being arranged so as to provide, as the first measuring signal, a first measuring voltage ($U_S$) adjustably proportional to the magnetic field in the air-gap, the second measuring signal being a voltage ($U_R$) appearing at the terminals of a measuring resistor connected in series with said measuring winding.

The measuring circuit is preferably arranged so as to add together said first and second measuring voltages.

The measuring circuit is further preferably arranged and adjusted so that a sinusoidal reference current flowing in said conductor for the current to be measured produces, when the measuring winding is disconnected, a measuring voltage equal to the theoretical voltage which would be produced at the terminals of said measuring resistor by an ideal current intensity transformer without air-gap.

In a preferred embodiment, the Hall effect device having an input power supply terminal and an output power supply terminal for connection to an energizing current generator, has said output power supply terminal connected to an output terminal of an operational amplifier having two inputs, one of which is connected to a reference potential for the measure, such as ground, and the other of these inputs being connected to one of the measuring terminals of the Hall effect device. In this case, one measuring terminal of the Hall effect device is maintained at the reference potential, and the measuring voltage provided by the Hall effect device appears at the other measuring terminal with respect to said reference potential.

The device preferably comprises an adjustable gain amplifier, at one input of which is applied the measuring voltage provided by the Hall effect device and one output of which is connected to one terminal of said measuring resistor, the other terminal of this resistor providing the output terminal of the measuring circuit. The measuring resistor can also be connected to an output terminal of the Hall effect device, providing the measuring signal, the Hall effect device being energized via power supply terminals from a current generator supplying an adjustable energizing current.

The present device can comprise two or more air-gaps, each provided with a magnetic field detector, each detector delivering a signal which is a function of the magnetic field in the corresponding air-gap, the measuring circuit being arranged to effect the addition of the signals provided by these detectors and of the second measuring signal which is a function of the current in the measuring winding.

The present device further preferably comprises a safety circuit arranged so as to detect the rise above at least one threshold of the measuring voltage produced by the Hall effect device, and to generate a fault signal when such a rise occurs.

Other characteristics, advantages and features of the invention will become apparent from the following description of an examplary embodiment, illustrated in the appended drawing, wherein.

Figure 1:
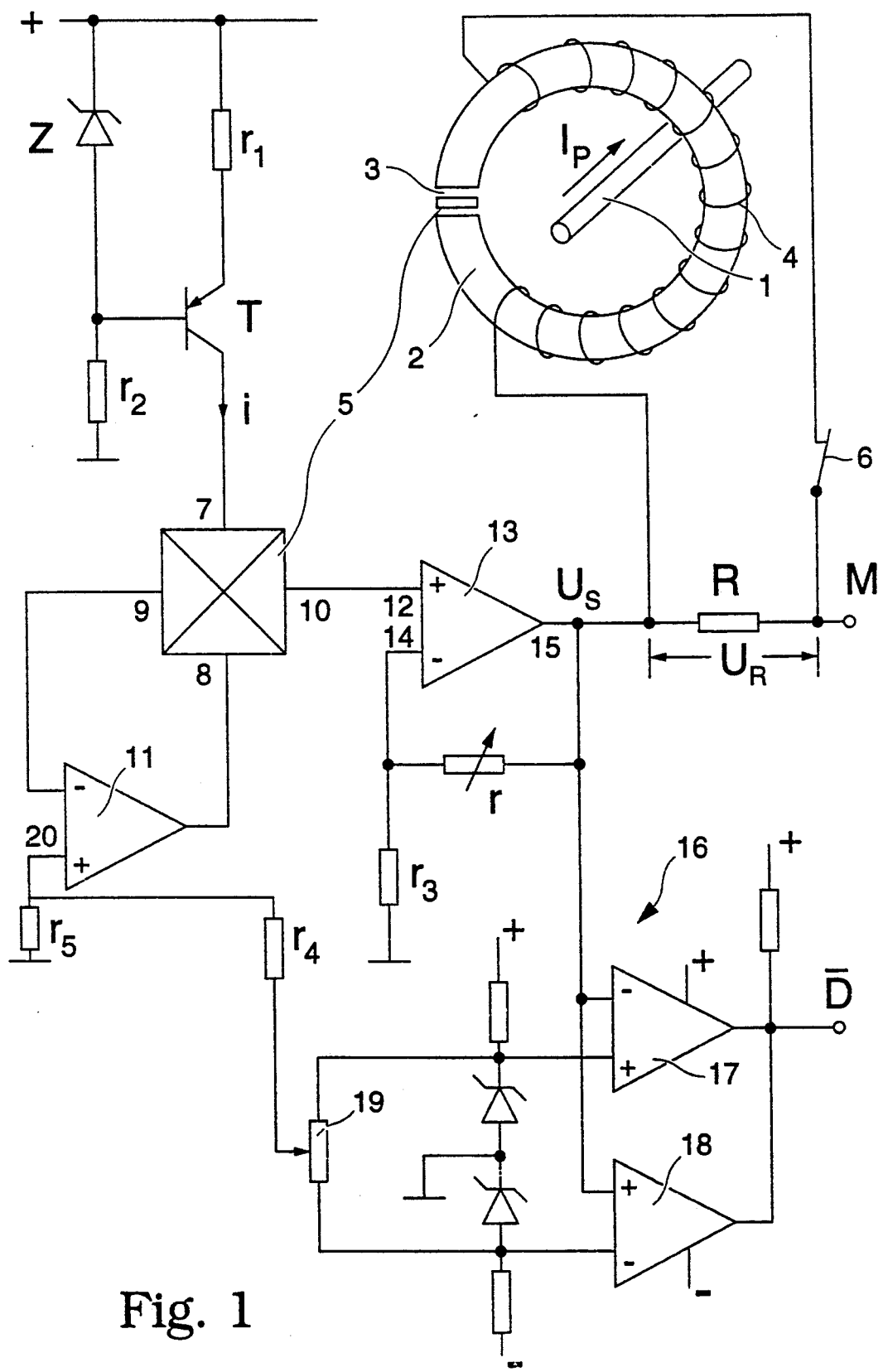
FIG. 1 illustrates a current measuring device according to the invention with its measuring circuit.

In the diagram of FIG. 1, the primary current to be measured $I_P$ flows through a conductor 1 which is surrounded transversely by a magnetic circuit 2 having an air-gap 3. This magnetic circuit can be in the form, for example, of a toroidal core made of a material having a good magnetic permeability or of stacked metal sheets forming a laminated structure similar to that of a transformer core. A measuring winding 4 is provided on this magnetic circuit and is connected through a connecting device represented schematically by a switch 6, to a measuring resistance R. A Hall cell 5 is placed in the air-gap 3, so as to be subjected to the effect of the magnetic field appearing in this air-gap.

The Hall cell 5 is shown separately with its connections in the wiring diagram of FIG. 1. An energizing current i is fed to the cell 5 via a current generator comprised, for example, of a circuit including a transistor T, resistors $r_1$ and $r_2$, and a Zener diode Z connected as illustrated in FIG. 1 to a first power supply terminal 7 of the cell. The potential of the second power supply terminal 8 of the cell is controlled continuously by an operational amplifier 11 mounted as shown in FIG. 1 so that a first measuring terminal 9 of the Hall cell connected to a first input (−) of the amplifier 11 is maintained at the potential applied to a second input (+) of this amplifier, this potential providing a reference potential, such as the ground in the example of FIG. 1. Accordingly, at the second measuring terminal 10 of the Hall cell, there appears a measuring voltage with respect to the ground which is proportional to the magnetic field H prevailing in the air-gap 3.

The output terminal 10 is connected to a first input terminal 12 of an operational amplifier 13, a second input terminal 14 of which is connected to an intermediate point of a voltage divider connected between the ground and an output terminal 15 of this operational amplifier 13. The voltage divider includes in this case a fixed resistor $r_3$ and a variable resistor r allowing to control the level of the measuring voltage $U_S$ appearing at the output 15, in other words, to adjust the proportionality factor between this voltage and the magnetic field H.

When the current $I_P$ to be measured comprises, for example, a d.c. component and a variable component, the latter induces a back-electromotive force in the winding 4. This winding being connected to the resistor R, the corresponding ampere-turns $AT_S$, the primary ampere-turns $AT_P$, i.e. in this case $I_P$, and the magnetic field H are related by the relationship $AT_P = H \cdot L + AT_S$, L being the length of the air-gap. The voltage $U_S$ thus provides a measure of the component H.L of the primary current $I_P$, which component provides the magnetization of the magnetic circuit, i.e. in fact establishes the flux in the air-gap, since the very high permeability of the iron portion of the circuit allows to neglect the magnetomotive force necessary for the flux to circulate in the rest of the circuit. As to the voltage $U_R$ at the terminals of resistor R, it is a measure of the component of the primary current compensated by the secondary ampere-turns resulting from the variation of the magnetic flux.

In order to calibrate the voltage $U_S$ with respect to the voltage $U_R$, a reference primary current is used which can be a direct current or a sinusoidal current. For calibrating by means of a sinusoidal current, the winding 4 is disconnected by opening the switch 6 so that the measuring of the current is only made through the measure of the magnetic field in the air-gap. The voltage $U_S$ is then adjusted by setting the gain of the amplifier 13 by means of the resistor r so that the amplitude of $U_S$ is equal to the theoretical value of the amplitude of the voltage $U_R$, which would be generated by an ideal current intensity transformer without air-gap, i.e. in this case $U_S = R.I_P/N_S$, where $N_S$ is the number of turns of the winding 4. The voltages $U_R$ and $U_S$ can thus be added to provide a measure of the total current intensity including the d.c. component. In the diagram of FIG. 1, the total measuring voltage appears at terminal M, the resistor R being connected between the terminals 15 and M.

Figure 2:
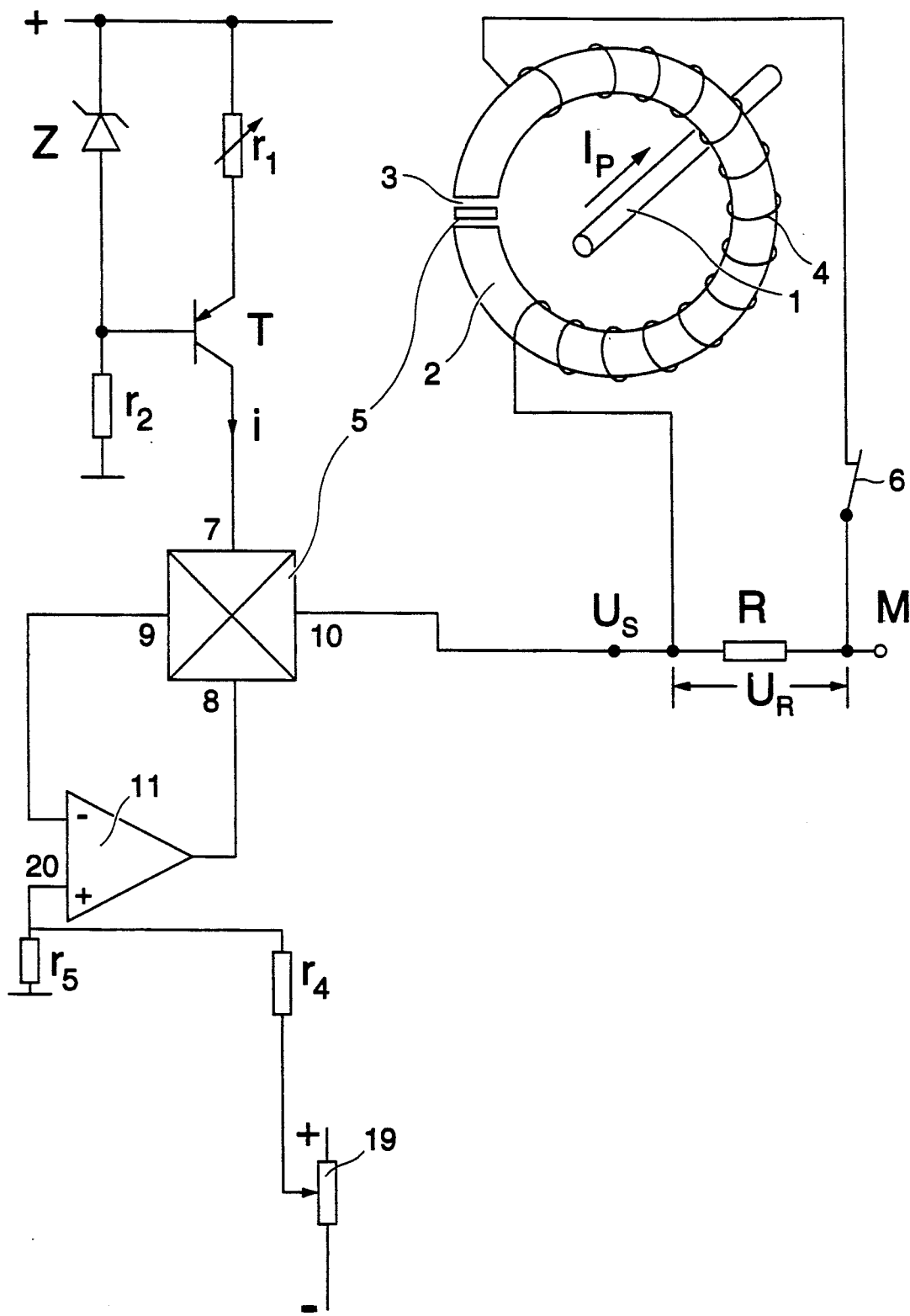
FIG. 2 shows another embodiment of the current measuring device of the invention.

According to one embodiment of the invention shown in FIG. 2, the mesuring resistor R is connected directly to the Hall cell, namely to the terminal 10 thereof, and this cell is supplied in power from a current generator providing an adjustable energizing current which allows the adjustment of the output voltage of the Hall cell.

It would also be possible to ground one terminal of the resistor R and to add the voltage $U_R$ to the output voltage of the Hall cell, which can be amplified or not, by means of appropriate resistors connected to the "—" input of an operational amplifier according to a known method. However, connecting the resistor R in series with the measuring voltage $U_S$ offers the advantage of not introducing a distortion of the measuring signal $U_R$ by the limitation in amplitude and in the bandwidth of the operational amplifier.

The present device is particularly advantageous for the accurate measure of pulsed currents or of short-circuit currents of a high amplitude, or in the case of a high primary current having a relatively low continuous component, or further in the case of alternating primary currents having d.c. component during a limited period of time, such as the switch-on currents of alternating current networks.

The diagram of FIG. 1 further shows the arrangement of a safety circuit indicated generally by 16, which is designed for detecting the rise above a threshold in the direction of one polarity or the other, of the measuring voltage provided by the Hall cell. For this purpose, the terminal 15 is connected to respective inputs "—" and "+" of two comparators 17,18, the corresponding inputs of the opposite sign of these comparators being connected to the terminals of a series-connection of two Zener diodes, the common connection point of which is grounded and the outer terminals of which are connected, respectively, through resistors to the positive and negative terminals of the voltage supply of the circuit. In parallel with these Zener diodes, there is connected a potentiometer 19, the slider of which is connected through a resistor $r_4$ to the input 20 of the operational amplifier 11, the resistor $r_5$ of a low resistance being connected between this input and ground. This potentiometer enables the cancellation of the offset voltage of the signal $U_S$ in the absence of a primary current, which offset voltage is caused by the addition of the offset voltages of the cell 5 and of the amplifiers 11 and 13.

The output terminals of comparators 17,18, which are comprised of transistors with open collectors, are connected together and, via a resistor, to the positive terminal of the voltage supply. Each comparator is arranged in such a manner as to become conductive when the measuring voltage, which is applied thereto, exceeds the threshold defined by the voltage of the corresponding Zener diode in the direction of the polarity of this voltage. Thus an output signal, such as a negative fault signal $\overline{D}$, appears in the illustrated circuit and indicates, for example, a saturation of the magnetic circuit or the operation in a range of the Hall cell which is no longer linear.

Figure 3:
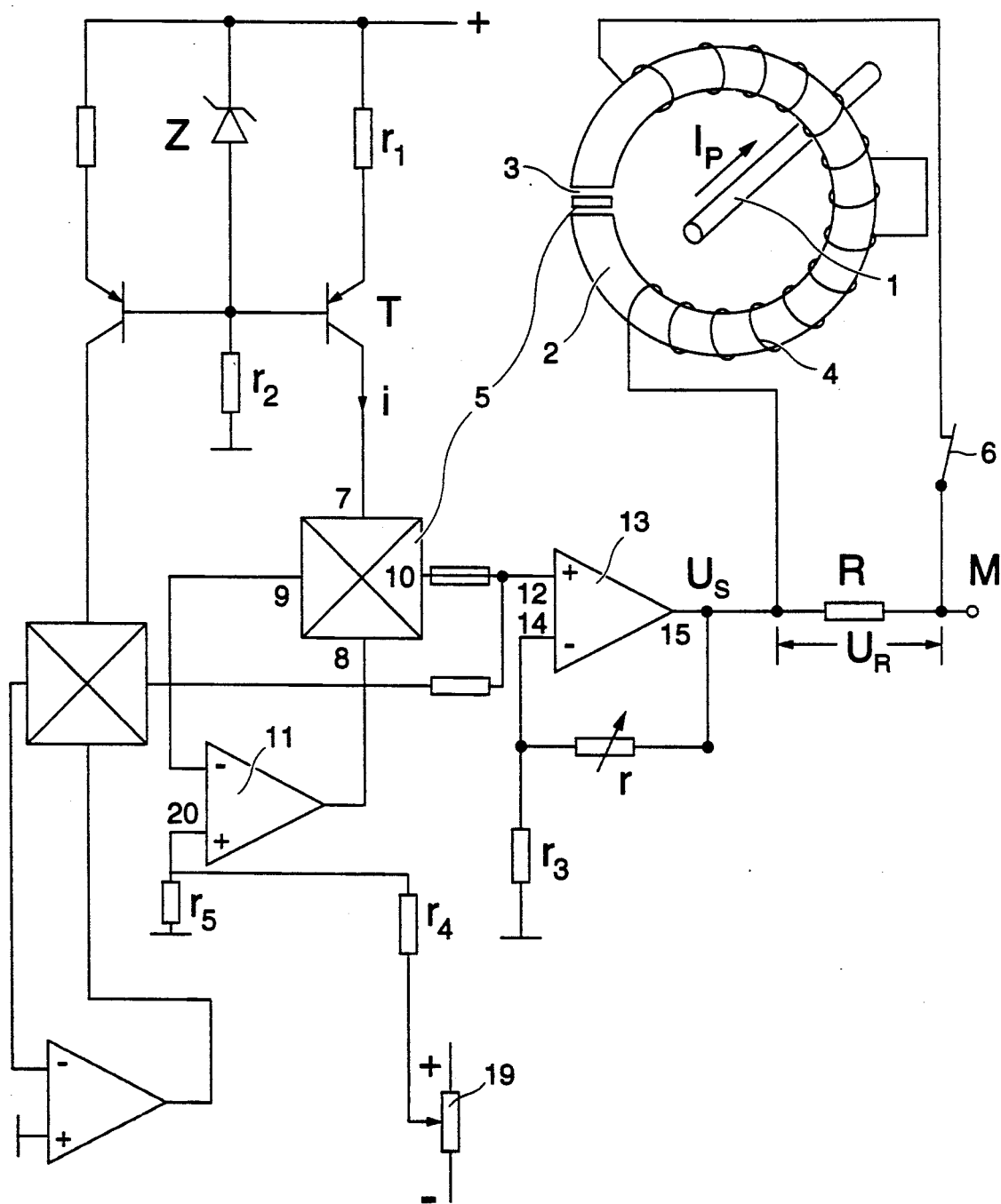
FIG. 3 shows still another embodiment of the current measuring device of the invention.
Figure 3:
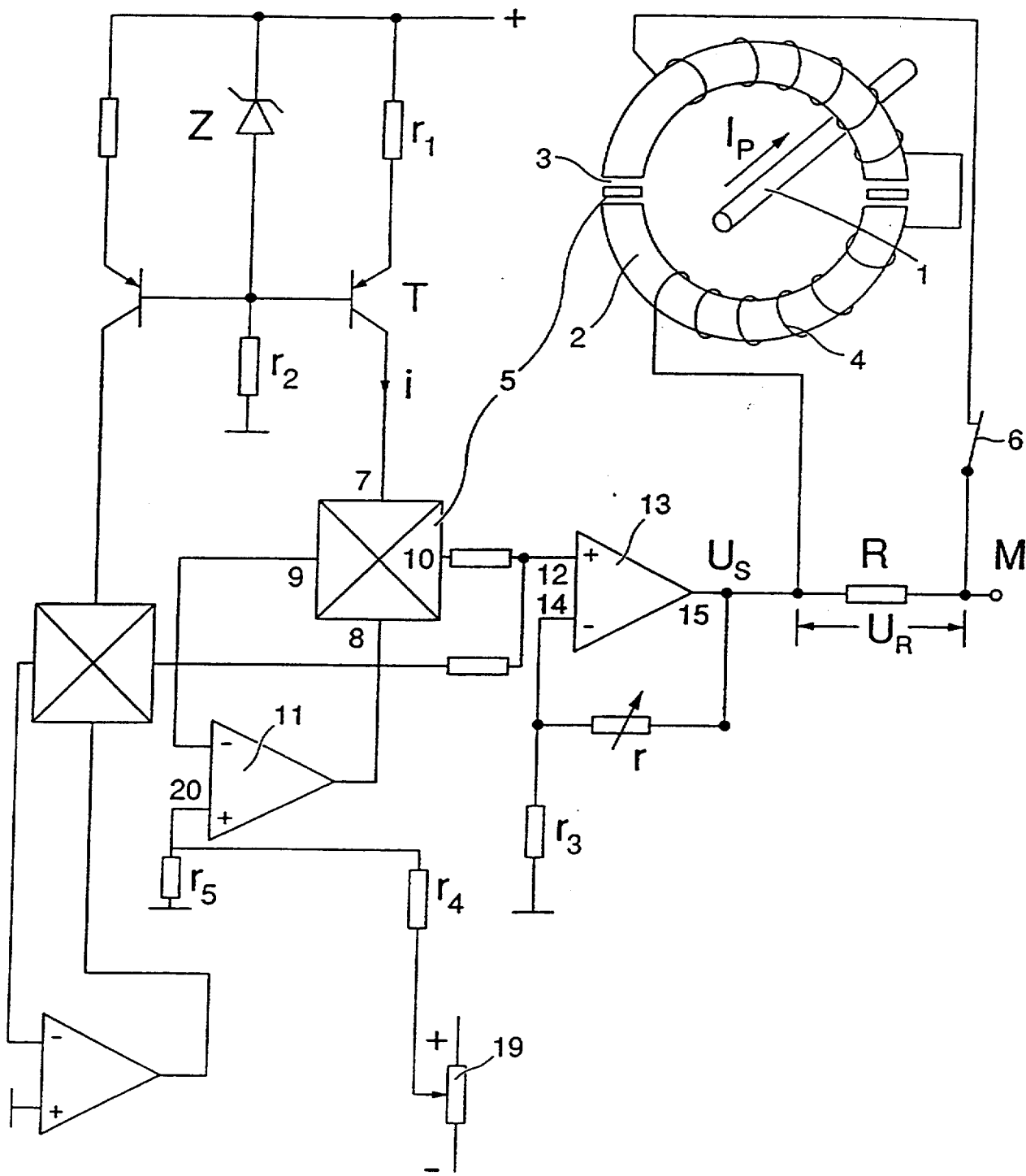

Depending upon the application, it can be advantageous to divide the magnetic circuit into two branches so as to obtain a circuit which can be opened to enable the introduction of primary conductors inside the circuit. In this case, the magnetic circuit will have, for example, as shown in FIG. 3 two air-gaps, each provided with a Hall cell, the individually adjustable measuring voltages of these cells being added in the measuring circuit. The measuring winding can be arranged on the two branches of the magnetic circuit, and the latter can be hinged, for example in the manner of clip-on ammeters.

The number of air-gaps and of corresponding Hall cells is not limited to two and will be preferably in excess of two in the case of very high currents to be measured.

In the case of a device with several cells, an addition of the voltages of the different cells is, for example, realized by connecting the terminal 10 of a first cell to the input of the power supply circuit of the following cell, i.e. to a terminal corresponding to terminal 20. Thus the voltage appearing at the output, such as 10, of each cell provides the reference potential for the following cell and the sum of the measuring voltages of all the cells appears at the output of the last cell.

On the other hand, in the case where the measured currents are relatively low, a primary conductor will be preferably used which is formed of several turns to improve the accuracy of the measure of the d.c. component.

I claim:

1. A current measuring device for measuring a variable electric current, comprising a current transformer with a magnetic circuit having at least one air-gap provided with a Hall effect device having an input supply terminal for connection to an energizing current generator and an output supply terminal, and having first and second measuring terminals, said output supply terminal of the Hall effect device being connected to an output terminal of an operational amplifier having first and second inputs, said first input being connected to a reference potential, and said second input being connected to said first measuring terminal of the Hall effect device, so that said first measuring terminal is maintained at said reference potential and the measuring voltage provided by the Hall effect device appears at said second measuring terminal with respect to said reference potential, said magnetic circuit being arranged so that it can be magnetically coupled with a primary conductor for the current to be measured, and bearing at least one secondary winding magnetically coupled with said magnetic circuit, said device further comprising an electric measuring circuit arranged for adding together the measuring voltage provided by the Hall effect device and a measuring voltage appearing at the terminals of a measuring resistor connected in series with said secondary winding, to provide an output voltage representing a measure of the current in the primary conductor.

2. A device according to claim 1, said measuring circuit comprising an adjustable gain amplifier, one input of which is connected to said secondary measuring terminal of said Hall effect device and one output of which is connected to a first terminal of said measuring resistor, the second terminal of said resistor being the output terminal of the measuring circuit.

3. A device according to claim 1, wherein said measuring resistor is connected to an output terminal of said Hall effect device, said Hall effect device being energized via supply terminals from a current generator supplying an adjustable energizing current.

4. A device according to claim 1, wherein said magnetic circuit comprises two or more air-gaps provided each with a Hall effect device, the measuring circuit being arranged to effect the addition of the signals delivered by these Hall effect devices and of the said second measuring signal.

5. A device according to claim 1, said measuring circuit comprising a safety circuit arranged so as to detect the rise above at least one threshold of the measuring voltage produced by said Hall effect device and to produce a fault signal when such a rise occurs.

* * * * *

UNITED STATES PATENT AND TRADEMARK OFFICE
CERTIFICATE OF CORRECTION

PATENT NO. :       5,146,156

DATED       :       September 8, 1992

INVENTOR(S) :   Marcel Etter

It is certified that error appears in the above-identified patent and that said Letters Patent is hereby corrected as shown below:

On the title page, item (19) , please correct the name of the inventor in the header line from "Marcel" to -- Etter --.

On the title page of the patent, in item (75), please correct the name of the inventor from "Etter Marcel" to -- Marcel Etter --.

On the title page of the patent, in item 30, please correct the foreign application priority data from Switzerland application no. "13399/89" to -- 1399/89-9 --.

Signed and Sealed this

Seventh Day of September, 1993

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.    : 5,146,156
DATED         : September 8, 1992
INVENTOR(S)   : Marcel Etter It is certified that error appears in the above-identified patent and that said Letters Patent is hereby corrected as shown below:

Sheet 3 of the drawings consisting of Fig. 3, should be deleted to be replaced with the corrected Fig. 3, as shown on the attached page.

Signed and Sealed this

First Day of November, 1994

Attest:

Attesting Officer

BRUCE LEHMAN

Commissioner of Patents and Trademarks